United States Patent
Chen

(10) Patent No.: US 10,356,910 B2
(45) Date of Patent: Jul. 16, 2019

(54) MANUFACTURING METHOD FOR FLEXIBLE PRINTED CIRCUIT BOARD

(71) Applicant: Wuhan China Star Optoelectronics Technology Co., Ltd., Wuhan (CN)

(72) Inventor: Juan Chen, Wuhan (CN)

(73) Assignee: WUHAN CHINA STAR OPTOELECTRONICS TECHNOLOGY CO., LTD., Wuhan, Hubei (CN)

(*) Notice: Subject to any disclaimer, the term of this patent is extended or adjusted under 35 U.S.C. 154(b) by 157 days.

(21) Appl. No.: 15/128,105

(22) PCT Filed: Jun. 23, 2016

(86) PCT No.: PCT/CN2016/086850
§ 371 (c)(1),
(2) Date: Sep. 21, 2016

(87) PCT Pub. No.: WO2017/206220
PCT Pub. Date: Dec. 7, 2017

(65) Prior Publication Data
US 2018/0177056 A1 Jun. 21, 2018

(30) Foreign Application Priority Data
Jun. 3, 2016 (CN) .......................... 2016 1 0393464

(51) Int. Cl.
H05K 3/10 (2006.01)
H05K 3/00 (2006.01)
(Continued)

(52) U.S. Cl.
CPC ............... *H05K 3/10* (2013.01); *H05K 1/028* (2013.01); *H05K 1/0218* (2013.01); *H05K 1/09* (2013.01);
(Continued)

(58) Field of Classification Search
CPC ........ H05K 3/10; H05K 1/0218; H05K 1/028; H05K 1/09
See application file for complete search history.

(56) References Cited

U.S. PATENT DOCUMENTS 5,976,391 A * 11/1999 Belke, Jr. ............... H05K 3/022
216/13
6,333,468 B1 * 12/2001 Endoh ................. H05K 1/0224
174/255
(Continued)

FOREIGN PATENT DOCUMENTS

CN 1799289 A 7/2006

*Primary Examiner* — Minh N Trinh
(74) *Attorney, Agent, or Firm* — Leong C. Lei

(57) ABSTRACT

The invention provides a manufacturing method for flexible printed circuit board, by liquefying the flexible insulating material and the metal material, coating the liquefied materials and solidifying the coated layers to form respectively the flexible insulating layer and the anti-EMI layer of the anti-EMI structure. As such, an adhesive layer is eliminated to achieve reducing the thickness of the flexible insulating layer and the anti-EMI layer and the material consumption, resulting in reduced production cost, reduced thickness of the flexible printed circuit board with anti-EMI structure, and improved quality.

10 Claims, 7 Drawing Sheets

(51) Int. Cl.
*H05K 1/02* (2006.01)
*H05K 1/09* (2006.01)
*H05K 9/00* (2006.01)

(52) U.S. Cl.
CPC ............. *H05K 3/00* (2013.01); *H05K 3/0011* (2013.01); *H05K 9/0084* (2013.01)

(56) References Cited

U.S. PATENT DOCUMENTS

| | | | | |
|---|---|---|---|---|
| 9,668,360 | B2* | 5/2017 | Davis | ................... C08G 18/345 |
| 2007/0190264 | A1* | 8/2007 | Zhang | ................... H05K 1/0216 |
| | | | | 427/487 |
| 2014/0321078 | A1* | 10/2014 | Wu | ...................... H05K 9/0054 |
| | | | | 361/752 |
| 2018/0177056 | A1* | 6/2018 | Chen | ................... H05K 1/0218 |

* cited by examiner

MANUFACTURING METHOD FOR FLEXIBLE PRINTED CIRCUIT BOARD

BACKGROUND OF THE INVENTION

1. Field of the Invention

The present invention relates to the field of display, and in particular to a manufacturing method for flexible printed circuit board.

2. The Related Arts

As the display technology develops rapidly, the flat displays, such as liquid crystal display (LCD), has the advantages of thinness, low power-consumption, and no radiation, and are widely used in applications, such as, mobile phone, TV, personal digital assistant (PDA), digital camera, notebook PC, desktop PC, and so on, and becomes the mainstream display technology.

The majority of the LCD devices are of the backlight type, which comprises an LCD panel and a backlight module. The operation principle of the LCD device is to utilize the liquid crystal placed between two parallel glass substrates. By using a voltage to a plurality of horizontal and vertical wires disposed between the two glass substrates to control the rotation of liquid crystal to refract the light emitted from the backlight module to display an image.

Refer to FIG. 1. FIG. 1 shows a schematic view of a known electronic product with an LCD, which comprises an LCD 1, a flexible printed circuit FPC) 3, connected to the LCD 1, and a system motherboard (not shown) connected to the FPC 3, wherein the FPC 3 is connected through a connector 4 to the system motherboard.

As the smart technology progresses, the speed and frequency of signal transmission grow higher, and the interference between signals become bigger. To avoid interference, the majority of electronic products will cover the FPC surface with a layer of anti-electromagnetic interference (Electromagnetic Interference, EMI) film to ensure the quality of high-speed high-frequency signal. Specifically, as shown in FIG. 2, FIG. 2 shows a schematic view of the known FPC structure of with the anti-EMI structure of the FPC, comprising: a stack from bottom up consecutively, a first anti-EMI layer 10, a first polyimide (PI) layer 20, a first adhesive layer 30, a first copper metal layer 40, a substrate 50, a second copper layer 60, a second adhesive layer 70, a second PI layer 80, and a second anti-EMI layer 90, wherein both the first anti-EMI layer 10 and the second anti-EMI layer 90 are conductive layers, and both the first PI layer 20 and the second PI layer 80 are insulating layers; all the above four layers are manufactured by attachment. Because the first anti-EMI layer 10, second layer 90 EMI, first PI layer 20 PI, and the second PI layer 80 have been formed in solid state prior to attachment, the thickness is unchangeable, and, moreover, the first adhesive layer 30 and the second adhesive layer 70 must be used for bonding, which leads to the excessive thickness of the FPC, resulting in the inability to meet the higher demand for overall height limit as well as the modern thinness trend of new electronic products.

SUMMARY OF THE INVENTION

The object of the present invention is to provide a manufacturing method for flexible printed circuit board, able to reduce the thickness of FPC with anti-EMI structure and reduce the production cost.

To achieve the above object, the present invention provides a manufacturing method for flexible printed circuit board, which comprises: Step 1: providing a flexible substrate, and forming a printed circuit on at least a side of the flexible substrate; Step 2: coating a liquefied flexible insulating material over the printed circuit, and solidifying the liquefied flexible insulating material to form a flexible insulating layer of the printed circuit; controlling the thickness of the flexible insulating layer to be less than 10 μm through coating; Step 3: coating a liquefied metal material over the flexible insulating layer, and solidifying the liquefied metal material to form an anti-electromagnetic interference (anti-EMI) layer; controlling the thickness of the anti-EMI layer to be less than 18 μm through coating.

In Step 1, a printed circuit is formed respectively on both sides of the flexible substrate, and each printed circuit comprises a conductive layer; in Step 2, a flexible insulating layer is formed respectively on the conductive layer of each printed circuit; and in Step 3, an anti-EMI layer is formed respectively on each flexible insulating layer.

In Step 1, a printed circuit is formed respectively on both sides of the flexible substrate, and each printed circuit comprises a stack of conductive layers, with an insulating protective layer disposed between two adjacent conductive layers, an adhesive layer is disposed on a side of each insulating protective layer close to the flexible substrate; in Step 2, a flexible insulating layer is formed respectively on the conductive layer of each printed circuit farthest from the flexible substrate; and in Step 3, an anti-EMI layer is formed respectively on each flexible insulating layer.

In Step 1, a printed circuit is formed on a side of the flexible substrate, and the printed circuit comprises a conductive layer; in Step 2, a flexible insulating layer is formed on the conductive layer of the printed circuit; and in Step 3, an anti-EMI layer is formed on the flexible insulating layer.

In Step 1, a printed circuit is formed on a side of the flexible substrate, and the printed circuit comprises a stack of conductive layers, with an insulating protective layer disposed between two adjacent conductive layers, an adhesive layer is disposed on a side of each insulating protective layer close to the flexible substrate; in Step 2, a flexible insulating layer is formed on the conductive layer of the printed circuit farthest from the flexible substrate; and in Step 3, an anti-EMI layer is formed on the flexible insulating layer.

In Step 2, the liquefied flexible insulating material is liquid PI, or liquid PET.

In Step 3, the liquefied metal material is liquid aluminum, or liquid silver.

In Step 2, the thickness of the flexible insulating layer is 4 μm-6 μm.

In Step 3, the thickness of the anti-EMI layer is 8 μm-12 μm.

In Step 2, a scratch process is used to coat a layer of the liquefied flexible insulating material; and in Step 3, a scratch process is used to coat a layer of the liquefied metal material.

The present invention also provides a manufacturing method for flexible printed circuit board, which comprises: Step 1: providing a flexible substrate, and forming a printed circuit on at least a side of the flexible substrate; Step 2: coating a liquefied flexible insulating material over the printed circuit, and solidifying the liquefied flexible insulating material to form a flexible insulating layer of the printed circuit; controlling the thickness of the flexible insulating layer to be less than 10 μm through coating; Step 3: coating a liquefied metal material over the flexible insulating layer, and solidifying the liquefied metal material to form an anti-electromagnetic interference (anti-EMI) layer; controlling the thickness of the anti-EMI layer to be less than 18 μm through coating; wherein in Step 2, the liquefied flexible insulating material is liquid PI, or liquid PET; wherein in Step 3, the liquefied metal material being liquid aluminum, or liquid silver; wherein in Step 2, the thickness of the flexible insulating layer is 4 μm-6 μm; wherein in Step 3, the thickness of the anti-EMI layer is 8 μm-12 μm.

Compared to the known techniques, the present invention provides the following advantages: the present invention provides a manufacturing method for flexible printed circuit board, by liquefying the flexible insulating material and the metal material, coating the liquefied materials and solidifying the coated layers to form respectively the flexible insulating layer and the anti-EMI layer of the anti-EMI structure. As such, an adhesive layer is eliminated to achieve reducing the thickness of the flexible insulating layer and the anti-EMI layer and the material consumption, resulting in reduced production cost, reduced thickness of the flexible printed circuit board with anti-EMI structure, and improved quality.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort. In the drawings.

DETAILED DESCRIPTION OF THE PREFERRED EMBODIMENTS

To further explain the technical means and effect of the present invention, the following refers to embodiments and drawings for detailed description.

Figure 7:
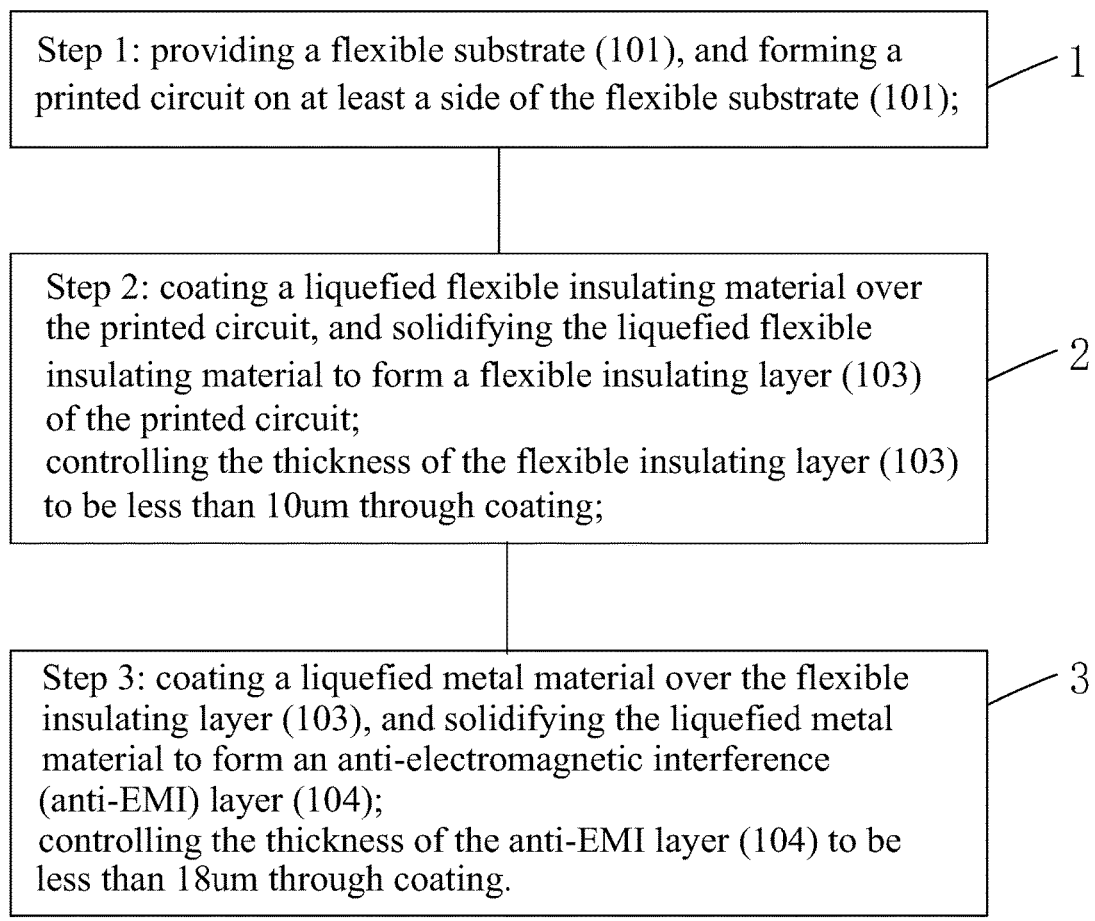
FIG. 7 is a schematic view showing the flowchart of the manufacturing method for flexible printed circuit board provided by an embodiment of the present invention.

Refer to FIG. 7. The present invention provides a manufacturing method for flexible printed circuit board, which comprises: Step 1: providing a flexible substrate 101, and forming a printed circuit on at least a side of the flexible substrate 101.

Step 2: coating a liquefied flexible insulating material over the printed circuit, and solidifying the liquefied flexible insulating material to form a flexible insulating layer 103 of the printed circuit; controlling the thickness of the flexible insulating layer to be less than 10 μm through coating.

Preferably, the liquefied flexible insulating material is a liquid polyimide (PI), or liquid polyethylene terephthalate (PET). Specifically, in Step 2, by using a coating knife in coating the liquefied flexible insulating material, the thickness of the liquefied flexible insulating material and the thickness of the formed flexible insulating layer 103 can be better controlled. Specifically, the process comprises: stirring the liquefied flexible insulating material, extracting the flexible substrate 101 with formed printed circuit from the roll of flexible circuit board, using scratch coating to coat a layer of liquefied flexible insulating material on the printed circuit, drying and solidifying the coated liquefied flexible insulating material on the flexible substrate 101 to form the flexible insulating layer 103, and then rewinding the flexible substrate 101 with formed flexible insulating layer 103 into a roll for transferring to the next step for subsequent processing. In other words, the roll-to-roll manner is used in manufacturing.

Moreover, the flexible insulating layer 103 is usually thicker than 1 μm. Preferably, the thickness of the flexible insulating layer 103 is 4 μm-6 μm.

Step 3: coating a liquefied metal material over the flexible insulating layer 103, and solidifying the liquefied metal material to form an anti-electromagnetic interference (anti-EMI) layer 104; controlling the thickness of the anti-EMI layer 104 to be less than 18 μm through coating.

Preferably, the liquefied metal material is a liquid aluminum (Al), or liquid silver (Ag). Specifically, in Step 3, by using a coating knife in coating the liquefied metal material, the thickness of the liquefied metal material and the thickness of the formed anti-EMI layer 104 can be better controlled. Specifically, the process comprises: stirring the liquefied metal material, extracting the flexible substrate 101 with formed flexible insulating layer 103 from the roll of flexible circuit board from Step 2, using scratch coating to coat a layer of liquefied metal material on the flexible insulating layer 103, drying and solidifying the coated liquefied metal material on the flexible substrate 101 to form the anti-EMI layer 104, and then rewinding the flexible substrate 101 with formed anti-EMI layer 104 into a roll. Moreover, the anti-EMI layer 104 is usually thicker than 2 μm. Preferably, the thickness of the anti-EMI layer 104 is 8 μm-12 μm.

Specifically, the manufacturing method for flexible printed circuit board is applicable to the manufacturing of double-sided single-layered flexible printed circuit board, double-sided multi-layered flexible printed circuit board, single-sided single-layered flexible printed circuit board, and single-sided multi-layered flexible printed circuit board.

Figure 1:
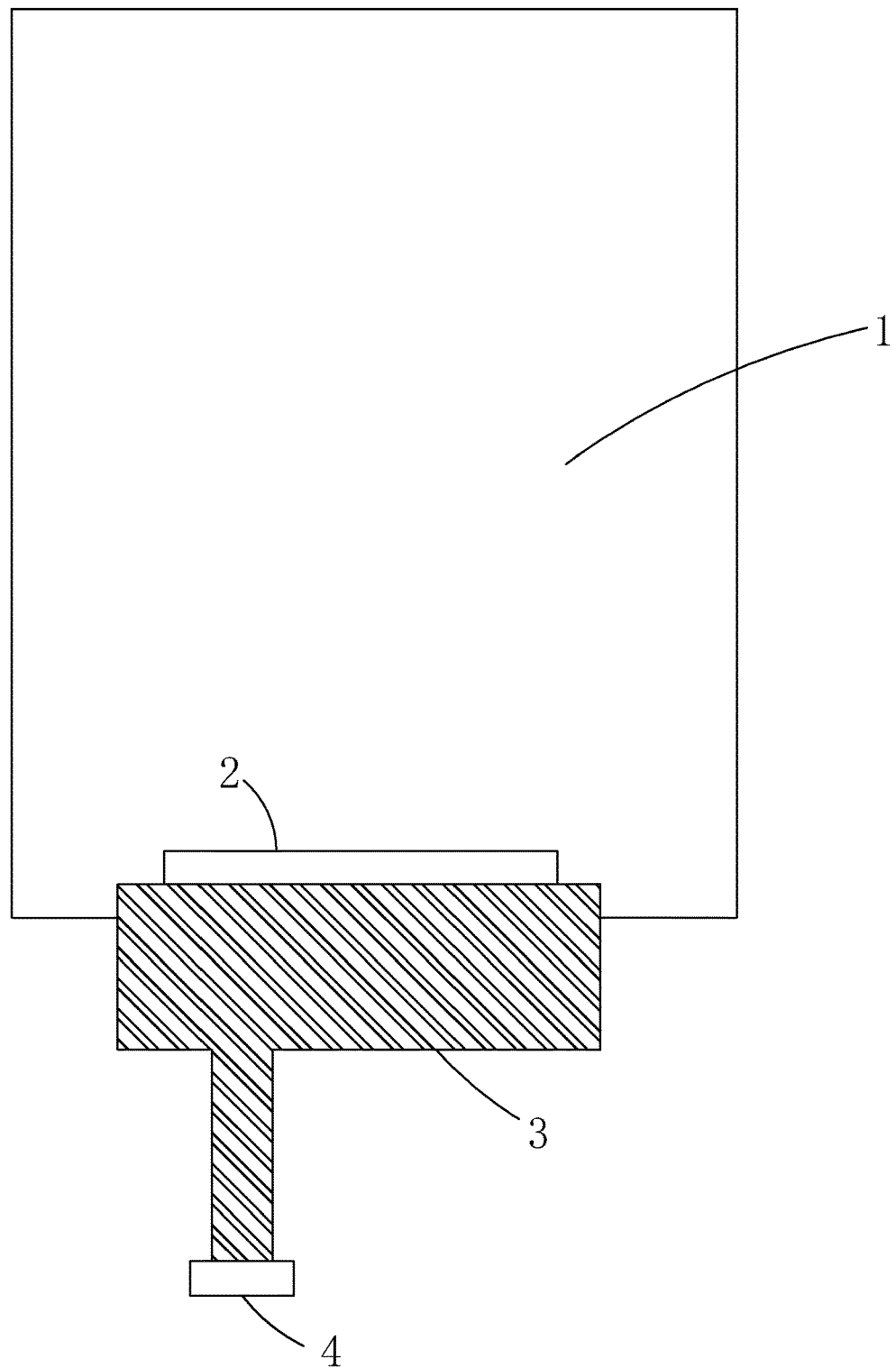
FIG. 1 is a schematic view showing the structure of a known electronic product with LCD.
Figure 2:
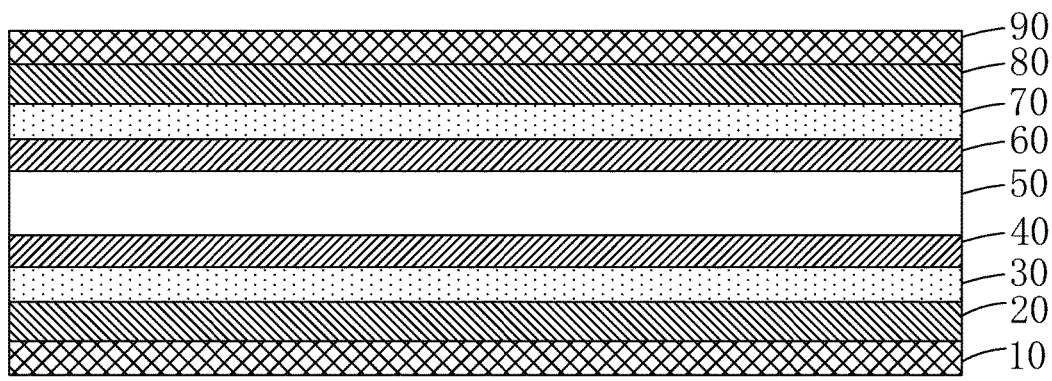
FIG. 2 is a schematic view showing the structure of a known flexible printed circuit board with anti-EMI structure.
Figure 3:
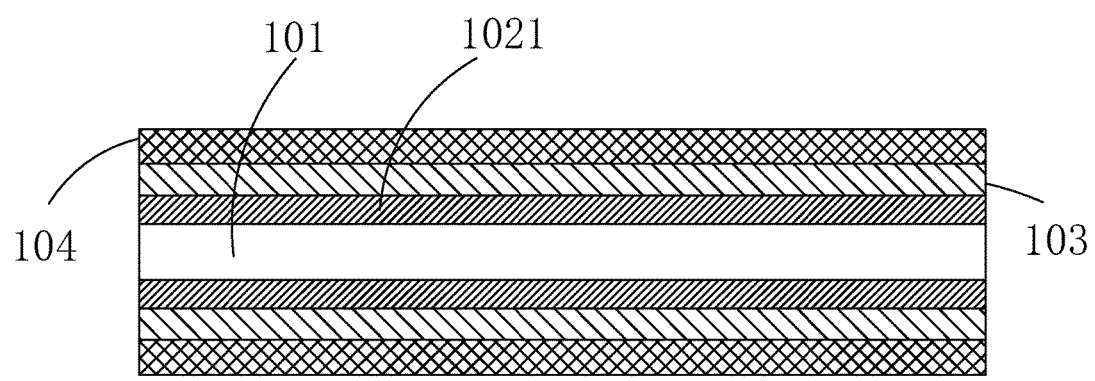
FIG. 3 is a schematic view showing the manufacturing method for flexible printed circuit board provided by a first embodiment of the present invention.

Specifically, refer to FIG. 3. In the first embodiment of the present invention, the flexible printed circuit board is a double-sided single-layered flexible printed circuit board. In other words, a printed circuit is formed respectively on both sides of the flexible substrate 101, and each printed circuit comprises a conductive layer 1021. Correspondingly, in Step 2, a flexible insulating layer 103 is formed respectively on the conductive layer 1021 of each printed circuit; and in Step 3, an anti-EMI layer 104 is formed respectively on each flexible insulating layer 103. Preferably, the conductive layer 1021 is made of copper or gold, specifically, copper foil or gold foil so as to make the conductive layer 1021 flexible.

Figure 4:
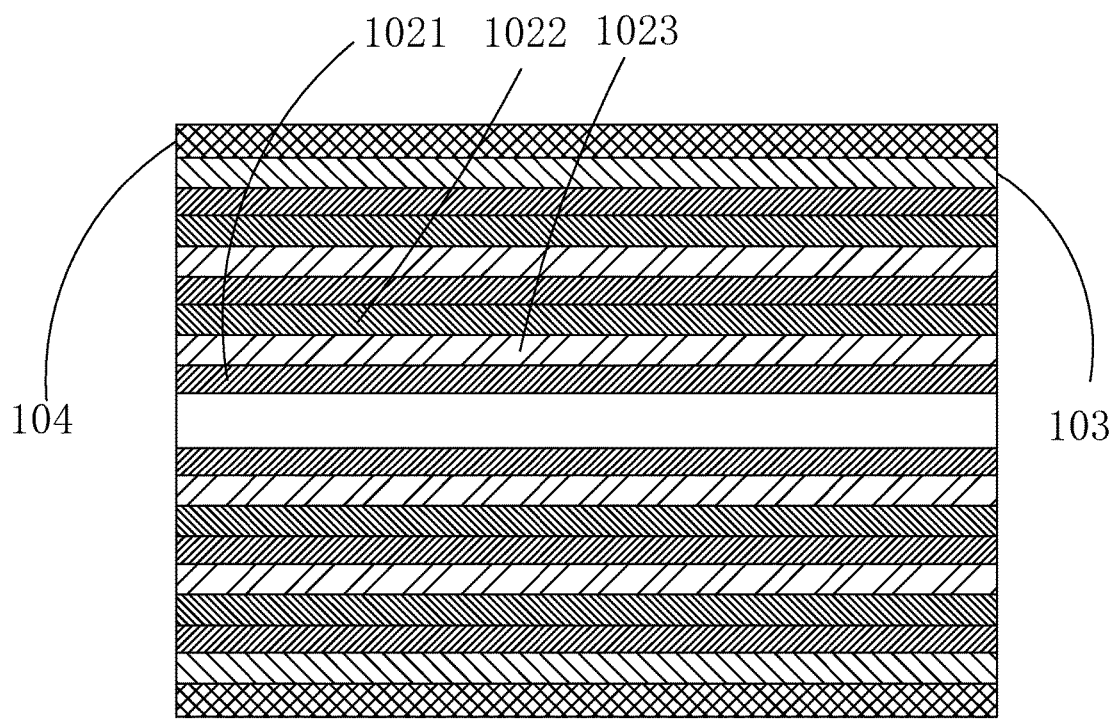
FIG. 4 is a schematic view showing the manufacturing method for flexible printed circuit board provided by a second embodiment of the present invention.

Specifically, refer to FIG. 4. In the second embodiment of the present invention, the flexible printed circuit board is a double-sided multi-layered flexible printed circuit board. In other words, a printed circuit is formed respectively on both sides of the flexible substrate 101, and each printed circuit comprises a stack of conductive layers 1021, with an insulating protective layer 1022 disposed between two adjacent conductive layers 1021, an adhesive layer 1023 is disposed on a side of each insulating protective layer 1022 close to the flexible substrate 101. Correspondingly, in Step 2, a flexible insulating layer 103 is formed respectively on the conductive layer 1021 of each printed circuit farthest from the flexible substrate 101; and in Step 3, an anti-EMI layer 104 is formed respectively on each flexible insulating layer 103. Preferably, the conductive layer 1021 is made of copper or gold, specifically, copper foil or gold foil so as to make the conductive layer 1021 flexible. The insulating protective layer 1022 is preferably made of PI.

Figure 5:
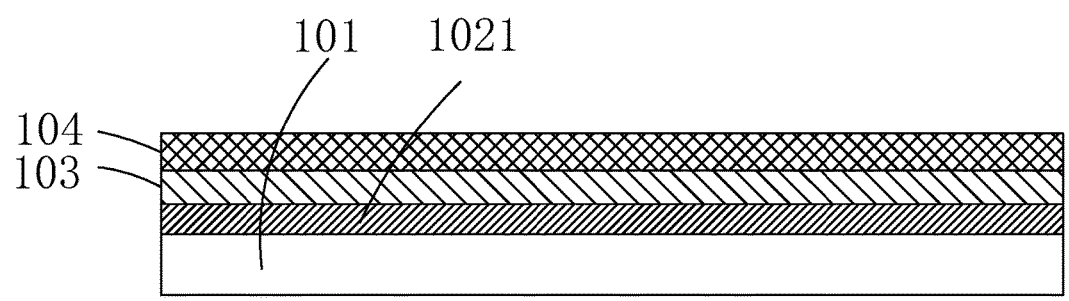
FIG. 5 is a schematic view showing the manufacturing method for flexible printed circuit board provided by a third embodiment of the present invention.

Specifically, refer to FIG. 5. In the third embodiment of the present invention, the flexible printed circuit board is a single-sided single-layered flexible printed circuit board. In other words, a printed circuit is formed on a side of the flexible substrate 101, and the printed circuit comprises only a conductive layer 1021. Correspondingly, in Step 2, a flexible insulating layer 103 is formed on the conductive layer 1021 of the printed circuit; and in Step 3, an anti-EMI layer 104 is formed on the flexible insulating layer 103. Preferably, the conductive layer 1021 is made of copper or gold, specifically, copper foil or gold foil so as to make the conductive layer 1021 flexible.

Figure 6:
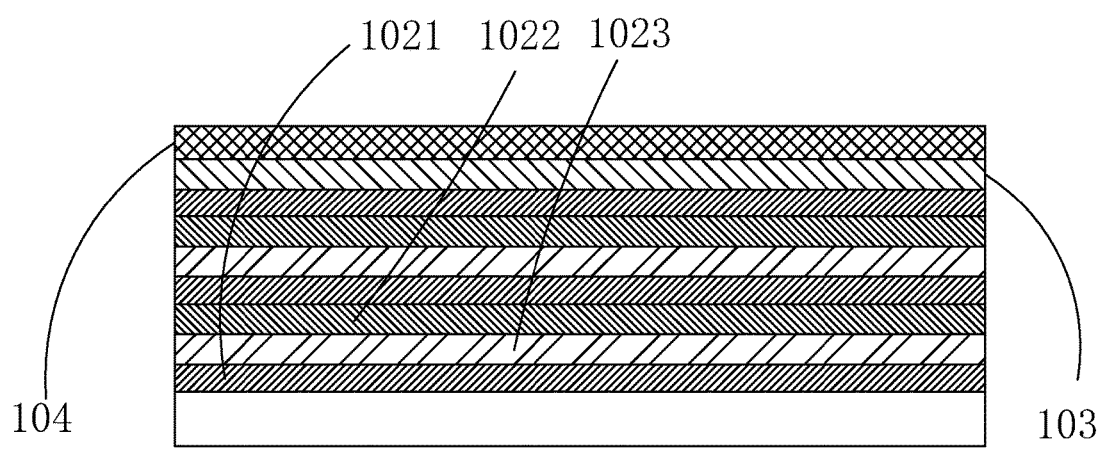
FIG. 6 is a schematic view showing the manufacturing method for flexible printed circuit board provided by a fourth embodiment of the present invention.

Specifically, refer to FIG. 6. In the fourth embodiment of the present invention, the flexible printed circuit board is a single-sided multi-layered flexible printed circuit board. In other words, a printed circuit is formed on a side of the flexible substrate 101, and the printed circuit comprises a stack of conductive layers 1021, with an insulating protective layer 1022 disposed between two adjacent conductive layers 1021, an adhesive layer 1023 is disposed on a side of each insulating protective layer 1022 close to the flexible substrate 101. Correspondingly, in Step 2, a flexible insulating layer 103 is formed on the conductive layer 1021 of each printed circuit farthest from the flexible substrate 101; and in Step 3, an anti-EMI layer 104 is formed on the flexible insulating layer 103. Preferably, the conductive layer 1021 is made of copper or gold, specifically, copper foil or gold foil so as to make the conductive layer 1021 flexible. The insulating protective layer 1022 is preferably made of PI.

In summary, the present invention provides a manufacturing method for flexible printed circuit board, by liquefying the flexible insulating material and the metal material, coating the liquefied materials and solidifying the coated layers to form respectively the flexible insulating layer and the anti-EMI layer of the anti-EMI structure. As such, an adhesive layer is eliminated to achieve reducing the thickness of the flexible insulating layer and the anti-EMI layer and the material consumption, resulting in reduced production cost, reduced thickness of the flexible printed circuit board with anti-EMI structure, and improved quality.

It should be noted that in the present disclosure the terms, such as, first, second are only for distinguishing an entity or operation from another entity or operation, and does not imply any specific relation or order between the entities or operations. Also, the terms "comprises", "include", and other similar variations, do not exclude the inclusion of other non-listed elements. Without further restrictions, the expression "comprises a . . . " does not exclude other identical elements from presence besides the listed elements.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. A manufacturing method for flexible printed circuit board, comprising steps of:
    providing a flexible substrate, and forming a printed circuit on at least a side of the flexible substrate;
    coating a liquefied flexible insulating material over the printed circuit, and solidifying the liquefied flexible insulating material to form a flexible insulating layer of the printed circuit;
    controlling the thickness of the flexible insulating layer to be less than 10 μm through coating; and
    coating a liquefied metal material over the flexible insulating layer, and solidifying the liquefied metal material to form an anti-electromagnetic interference (anti-EMI) layer;
    controlling the thickness of the anti-EMI layer to be less than 18 μm through coating so as to form the flexible printed circuit board;
    wherein the flexible insulating material is coated in a liquid form onto the printed circuit and then solidified to form the flexible insulating layer and the metal material is coated in a liquid form onto the flexible insulating layer to be in direct contact with the flexible insulating material and then solidified on the flexible insulating material so that the anti-electromagnetic interference layer is in direct contact with the flexible insulating layer.

2. The manufacturing method for flexible printed circuit board as claimed in claim 1, wherein the forming a printed circuit further comprising: forming a printed circuit on both sides of the flexible substrate, wherein each printed circuit comprises a conductive layer; the coating a liquefied flexible insulating material further comprising: forming a flexible insulating layer on the conductive layer of each printed circuit; and the coating a liquefied metal material further comprising: forming an anti-EMI layer on each flexible insulating layer.

3. The manufacturing method for flexible printed circuit board as claimed in claim 1, wherein the forming a printed circuit further comprising: forming a printed circuit on both sides of the flexible substrate, wherein each printed circuit comprises a stack of conductive layers, with an insulating protective layer disposed between two adjacent conductive layers, and disposing an adhesive layer on a side of each insulating protective layer close to the flexible substrate; the coating a liquefied flexible insulating material further comprising: forming a flexible insulating layer on the conductive layer of each printed circuit farthest from the flexible substrate; and the coating a liquefied metal material further comprising: forming an anti-EMI layer is formed respectively on each flexible insulating layer.

4. The manufacturing method for flexible printed circuit board as claimed in claim 1, wherein the forming a printed circuit further comprising: forming a printed circuit on a side of the flexible substrate, wherein the printed circuit comprises a conductive layer; the coating a liquefied flexible insulating material further comprising: forming a flexible insulating layer on the conductive layer of the printed circuit; and the coating a liquefied metal material further comprising: forming an anti-EMI layer on the flexible insulating layer.

5. The manufacturing method for flexible printed circuit board as claimed in claim 1, wherein the forming a printed circuit further comprising: forming a printed circuit on a side of the flexible substrate, wherein the printed circuit comprises a stack of conductive layers, with an insulating protective layer disposed between two adjacent conductive layers, and disposing an adhesive layer on a side of each insulating protective layer close to the flexible substrate; the coating a liquefied flexible insulating material further comprising: forming a flexible insulating layer on the conductive layer of the printed circuit farthest from the flexible substrate; and the coating a liquefied metal material further comprising: forming an anti-EMI layer on the flexible insulating layer.

6. The manufacturing method for flexible printed circuit board as claimed in claim 1, wherein the coating a liquefied flexible insulating material further comprising: coating liquid polyimide (PI) or liquid polyethylene terephthalate (PET) as the liquefied flexible insulating material over the printed circuit.

7. The manufacturing method for flexible printed circuit board as claimed in claim 1, wherein the coating a liquefied metal material further comprising: coating liquid aluminum or liquid silver as the liquefied metal material over the flexible insulating layer.

8. The manufacturing method for flexible printed circuit board as claimed in claim 1, wherein the thickness of the flexible insulating layer is from 4 μm to 6 μm.

9. The manufacturing method for flexible printed circuit board as claimed in claim 1, wherein the thickness of the anti-EMI layer is from 8 μm to 12 μm.

10. The manufacturing method for flexible printed circuit board as claimed in claim 1, wherein the coating a liquefied flexible insulating material further comprising: performing a scratch process to coat a layer of the liquefied flexible insulating material on the printed circuit; and the coating a liquefied metal material further comprising: performing a scratch process to coat a layer of the liquefied metal material on the flexible insulating layer.

* * * * *